United States Patent
Miller

(10) Patent No.: US 12,215,610 B1
(45) Date of Patent: Feb. 4, 2025

(54) AIR TURBINE ENERGY RECAPTURE SYSTEM

(71) Applicant: Google LLC, Mountain View, CA (US)

(72) Inventor: Travis James Miller, Mesa, AZ (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 18/376,225

(22) Filed: Oct. 3, 2023

(51) Int. Cl.
  *F01K 7/30* (2006.01)
  *H05K 7/14* (2006.01)
  *H05K 7/20* (2006.01)

(52) U.S. Cl.
  CPC ............ *F01K 7/30* (2013.01); *H05K 7/1485* (2013.01); *H05K 7/20* (2013.01)

(58) Field of Classification Search
  CPC ........... F01K 7/30; H05K 7/1485; H05K 7/20
  See application file for complete search history.

(56) References Cited

U.S. PATENT DOCUMENTS

| | | | |
|---|---|---|---|
| 7,984,613 B2 | 7/2011 | DuBois | |
| 8,487,463 B2 | 7/2013 | Ho et al. | |
| 8,554,390 B2 * | 10/2013 | Canney | H05K 7/2079 361/699 |
| 9,275,767 B2 * | 3/2016 | Dederer | G21D 1/02 |
| 9,453,494 B2 | 9/2016 | Krippene | |
| 9,510,486 B1 * | 11/2016 | Gravina | H05K 7/20309 |
| 9,546,576 B2 * | 1/2017 | Campbell | F25B 27/02 |
| 9,894,809 B1 * | 2/2018 | Springs | H05K 7/20745 |
| 10,020,436 B1 * | 7/2018 | Gravina | H05K 7/1492 |
| 10,492,331 B1 * | 11/2019 | Towner | H05K 7/20745 |
| 2009/0078401 A1 | 3/2009 | Cichanowicz | |
| 2010/0024445 A1 | 2/2010 | Cichanowicz | |
| 2016/0186725 A1 | 6/2016 | Dofredo | |
| 2021/0014988 A1 * | 1/2021 | Lewis, II | H05K 5/0217 |

FOREIGN PATENT DOCUMENTS

KR   2010 0026017 A   3/2010

\* cited by examiner

Primary Examiner — Hoang M Nguyen
(74) Attorney, Agent, or Firm — Lerner David LLP

(57) ABSTRACT

A system includes a hot air vent extending about a heat source. The hot air vent is configured to produce an air flow by directing air heated by the heat source to rise upward along the hot air vent. The system further includes a wind turbine arranged at a top of the hot air vent configured to be operated by the heated air rising upward along the hot air vent.

18 Claims, 4 Drawing Sheets

AIR TURBINE ENERGY RECAPTURE SYSTEM

BACKGROUND

Data centers are among the largest energy consumers globally. The most significant source of energy usage within data centers is the cooling systems, which cool servers that heat up during processing activities. Such servers often require constant cooling to avoid reductions in processing speeds due to overheating processors or other server components. Moreover, without adequate cooling, there is a risk of damage or failure to the hardware of the server due to excessive heat. Typically, there are two methods of cooling in data centers: air-based cooling methods and water-based cooling methods.

BRIEF SUMMARY

According to an aspect of this disclosure, a system includes at least one of a hot air vent extending about a heat source or a cooling unit configured to direct cooled air toward the heat source. The hot air vent is configured to produce an air flow by directing air heated by the heat source to rise upward along the hot air vent. At least one wind turbine is arranged at least at a top of the hot air vent or downstream the cooling unit. The at least one wind turbine is configured to be operated by the heated air rising upward along the hot air vent or by the cooled air emitted from the cooling unit.

In one example, the cooling unit is configured to cool the heated air rising from the hot air vent and to direct the cooled air down the alley producing the air circulation in the alley.

In one example, the at least one wind turbine is arranged between the hot air vent and the cooling unit.

In an example, the heat source is a server.

In an example, the at least one wind turbine is a residential wind turbine.

In an example, the at least one wind turbine is configured to provide power to the heat source.

In one example, the at least one wind turbine is configured to provide power to the cooling unit.

In another example, the system further includes a battery for storing power generated by the at least one wind turbine.

According to one example, a data center includes a plurality of servers, and a hot air vent extending about the plurality of servers. The hot air vent is configured to direct air heated by the plurality of the servers upward along the hot air vent. A cooling unit is arranged above the plurality of servers and is configured to receive the heated air, to cool the heated air and to direct the cooled air down toward the plurality of servers. At least one wind turbine is arranged between the hot air vent and the cooling unit, or downstream of the cooling unit, and is configured to be operated by the heated air rising from the hot air vent or by the cooled air emitted from the cooling unit, respectively, to generate power.

In one example, the at least one wind turbine is a residential wind turbine.

In an example, the at least one wind turbine is configured to provide power to at least one of the cooling unit or at least one of the plurality of servers.

In an example, the data center may include a first blower configured to direct the heated air upward along the hot air vent and/or a second blower configured to direct the cooled air from the cooling unit toward the plurality of servers.

In another example, the data center may include a battery for storing at least a portion of power generated by the at least one wind turbine.

According to an aspect, a method for recapturing energy includes directing air heated by a heat source associated with a hot air vent upward along the hot air vent, directing air cooled by a cooling unit down toward the heat source underneath the cooling unit, and operating at least one wind turbine arranged between the alley and the cooling unit or downstream the cooling unit to recapture energy from the heated air or the cooled air, respectively, the wind turbine operated by the heated air or the cooled air to generate power.

The method may further include supplying at least a portion of the power generated by the at least one wind turbine to one or more of the cooling unit, the heat source, or a battery.

DETAILED DESCRIPTION

The technology generally relates to data center cooling systems. A data center cooling system may channel hot air generated by data center equipment to a cooling unit. The cooling unit cools the hot air and directs the cooled air back to the server floor to cool the data center equipment. Such a data center cooling system creates a wind tunnel effect with constant airflow.

The constant airflow of the heated air and the cooled air may be used to power a wind turbine. The wind turbine may generate power or electricity, which may be used to power data center equipment or other loads. In this regard, a wind turbine may be positioned between the server floor and the cooling unit, such that the wind turbine is exposed to the heated air being directed toward the cooling unit and/or to the cooled air being directed toward the server floor. As such, the wind turbine may recapture energy from the constant airflow created by the data center cooling system.

Figure 1A:
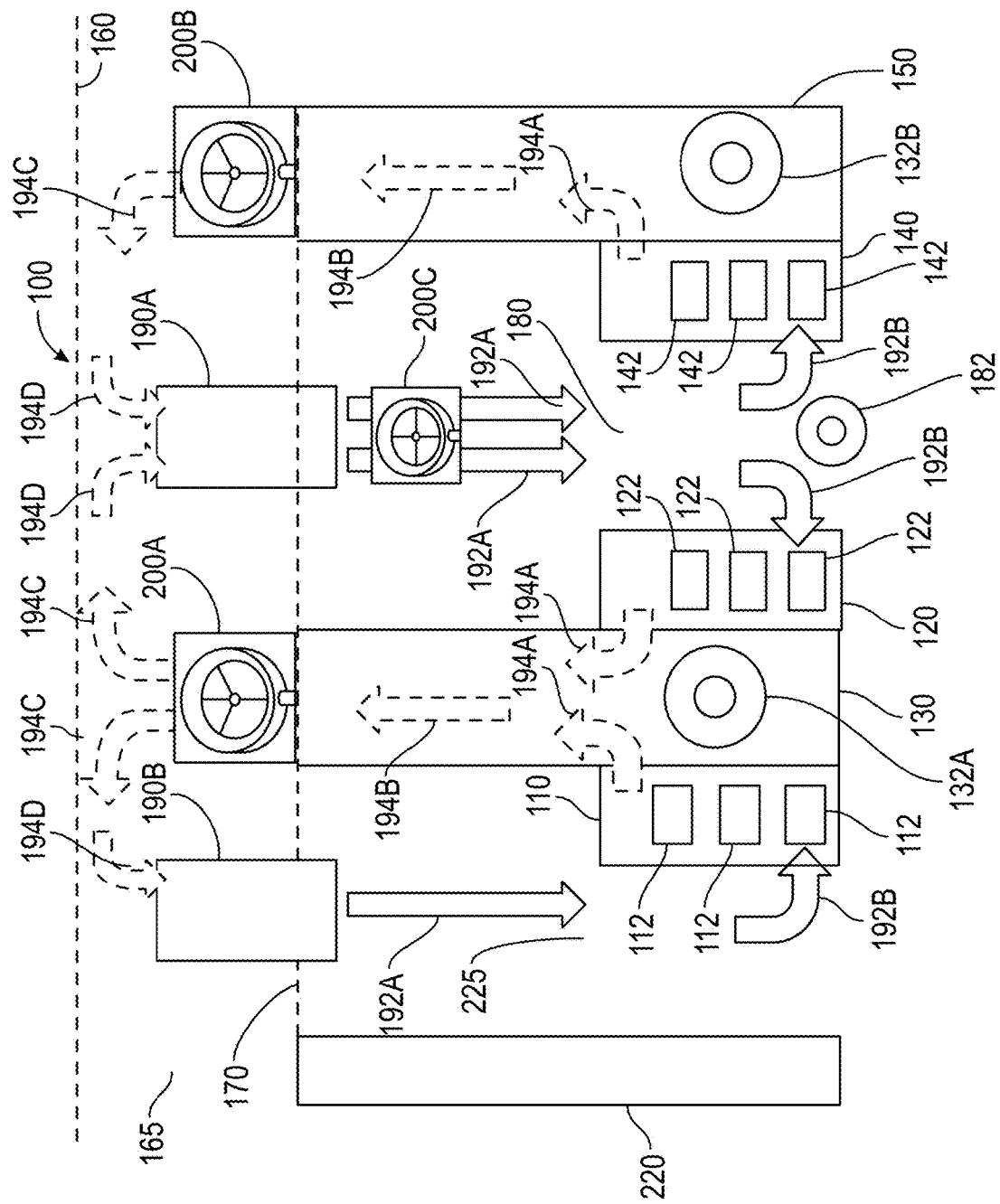
FIG. 1A is a schematic front view of the system according to aspects of the disclosure.
Figure 1B:
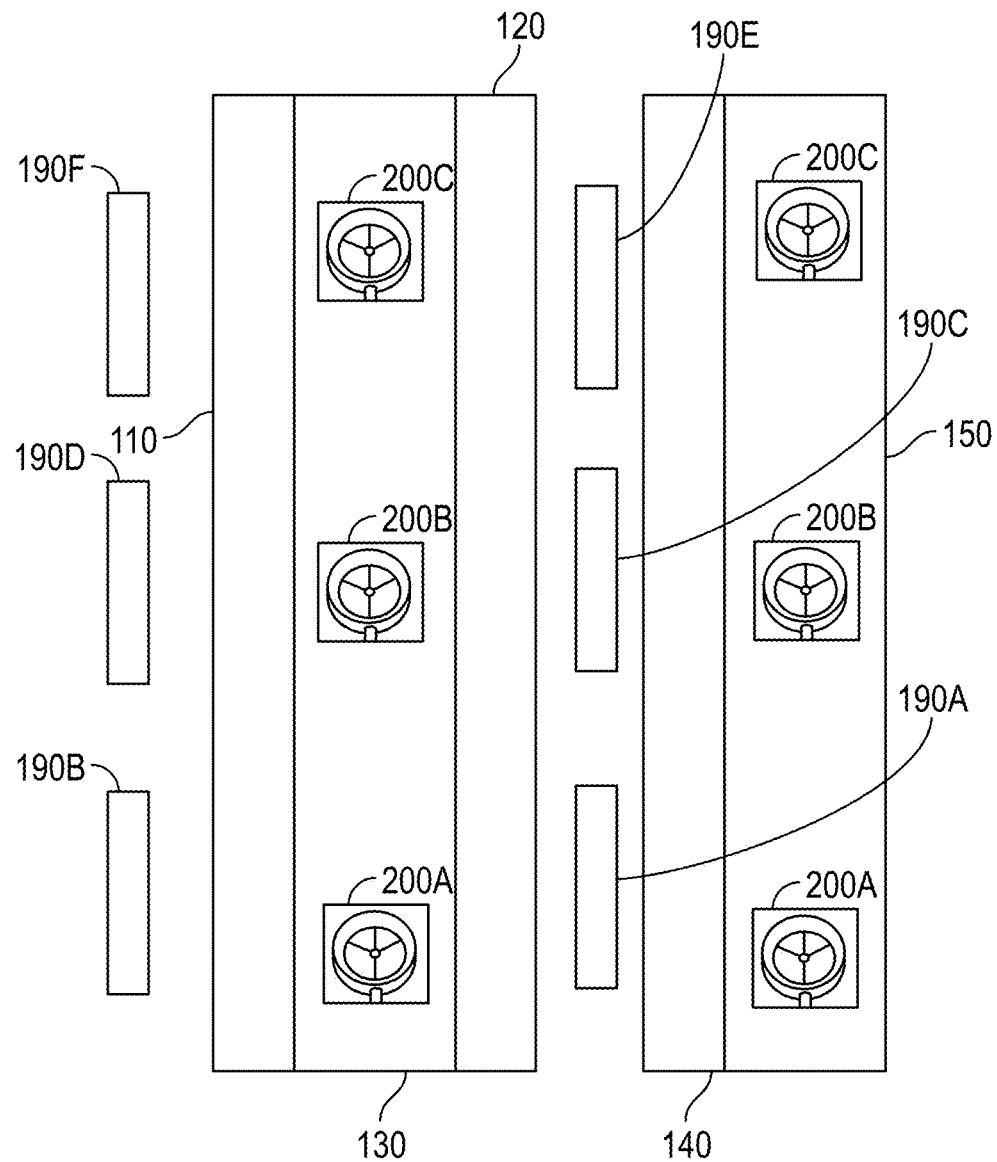
FIG. 1B is a schematic top view of the system of FIG. 1A.

FIGS. 1A and 1B are schematic front view and top view, respectively, of a data center cooling system positioned in a data center 100. The data center 100 includes a first rack 110, an adjacent second rack 120, a first hot air vent 130, a third rack 140, a second hot air vent 150, a hard ceiling 160, a drop ceiling 170, a space 165 between the hard ceiling 160 and the drop ceiling 170, and a wall 220. The first hot air vent 130 is arranged between the first rack 110 and the second rack 120. The second hot air vent 150 is arranged adjacent to the third rack 140. Each of the first hot air vent 130 and the second hot air vent 150 is configured to receive heated air from the adjacent racks. The heated air travels from the racks, upward toward the drop ceiling 170 and the hard ceiling 160, as illustrated by the broken line arrows within hot air vents 130, 150. While the illustrated embodiment illustrates three racks 110, 120, 130, and two hot air vents 130, 170, it will be understood that another example may include more than three or less than three racks and more than two or less than two hot air vents.

The second rack 120 and the third rack 140 define a first alley 180 therebetween. The first rack 110 and the wall 220 define a second alley 225 therebetween. Each of the first rack 110, the second rack 120, and the third rack 140 include a plurality of servers 112, 122, 142, respectively. The servers 112, 122, 142 generate heat during operation and may be considered heat sources. Although FIG. 1A illustrates only three servers in each rack, the racks may hold any number of servers. Moreover, the servers 112, 122, 142 may be held in the racks in any orientation and spacing relative to other servers.

Additionally, although FIGS. 1A and 1B illustrate first rack 110 as being parallel to second rack 120, and the third rack 140 being parallel to the second rack 120, the alignment of the racks 110, 120, 140 may be offset relative to one another. For instance, the first rack 110 may be at an angle relative to the second rack 120. Moreover, the racks 110,120, 140 may be of any shape, not just rectangular, as illustrated in FIGS. 1A and 1B.

A cooling system for a data center may include cooling units. For example, and as illustrated in FIGS. 1A and 1B, data center 100 includes cooling units 190A and 190B. While the illustrated example include six cooling units 190A, 190B, 190C, 190D, 190E, 190F, it will be understood that a cooling system may include more than six or less than six cooling units. The cooling units 190A, 190B-190F may be positioned near the drop ceiling 170 of the data center. For instance, the cooling units 190A, 190B-190F may be mounted to a drop ceiling, a finished ceiling, or attached to a wall or other supporting structure near the drop ceiling 160. The cooling units 190A-190F are arranged above the first, second, and third racks 110, 120, 140 and the alley 180. In the illustrated embodiment, the cooling units 190A 190C, 190E are arranged above the second rack 140, the alley 180, and the third rack 140. The cooling units 190B, 190D, 190E are arranged above the first rack 110 and the alley 225.

The cooling units 190A, 190B-190F are configured to receive heated air rising up the first and second hot air vents 130, 150 and cool the received heated air. The cooling units 190A-190F are also configured to direct the cooled air down the alley 180, as shown by arrows 192A, 192B. In this regard, the cooling units 190A-190F may include internal blowers or fans (not shown) for directing the cooled air in a desired direction down the alley 180 towards the first, second, and third racks 110, 120, 140. In some implementations, the data center cooling system may also include one or more external blowers or fans 182 arranged in the alley 180.

In some implementations, the data center cooling system may also include one or more external blowers or fans. For example, and as illustrated in FIG. 1A, fan 132A is positioned within first hot air vent 130 and fan 132B is arranged in the second hot air vent 150. Each fan 132A, 132B may be configured to direct the air heated by the servers 112, 122, 142 up the hot air vents 130, 150 upwards towards the ceiling. While directing the heated air upwards, the fans 132A, 132B may pull cooled air emitted from the cooling units 190A, 190B from the alley 180 into the respective one of the first, second, and third racks 110, 120, 140, as shown by arrows 194A, 194B, 194C, and 194D.

In some implementations, the data center cooling system may include one or more fans to direct the cooled air emitted from the cooling units towards the servers. For example, and as illustrated in FIG. 1A, a fan 182 is configured to push the cooled air emitted from the cooling units 190A, 190B into the second and third racks 120, 140 for cooling the servers 122, 142.

During operation, equipment in a data center, such as servers, may heat up. The heat from the equipment may heat the air within the data center. For instance, servers 112, 122, 142 illustrated in FIG. 1A may heat up due to processing activities. The heat from the servers 112, 122, 142 may heat the air in the first, second, and third racks 110, 120, 140. As the air in the first, second, and third racks 110, 120, 140 heats up, it rises up the respective hot air vents 130, 150, as shown by the arrows 194A, 194B, toward the ceilings 170, 160.

The hot air exiting the hot air vents 130, 150 enters the space 165 between the hard ceiling 160 and the drop ceiling 170 and is directed to the cooling units 190A, 190B. In an example, baffles, funnels, and other such mechanisms (not shown) may be arranged in the space 165 to guide the hot air toward the cooling units 190A-190F.

The cooling units 190A, 190C, 190E cool the heated air received from the first and second hot air vents 130, 150. The air cooled by the cooling units 190A, 190C, 190E is directed down the first and second alleys 180, 225, towards the servers 112, 122, 142 as shown by the arrows 192A, for example, by the internal blowers (not shown) of the cooling units 190A, 190C, 190E.

The cooled air entering the first and second alleys 180, 225 is denser than the warm air in the first and second alleys. As such, the cooled air moves below the warmed air in the first and second alleys 180, 225, thereby forcing the warmed air upwards towards the cooling units 190A-190F as well as into the first, second and third racks 110 120, 140. The internal blowers of the cooling units 190A-190F may be further configured to direct the cooled air towards the servers 112, 122, 142. The wall 220 also serves to direct the cooled air into the first rack 110.

When the cooled air comes in contact with the heated servers 112, 122, 142, the cooled air may cool the servers 112, 122, 142. In this regard, the cooled air may absorb the heat from the servers 112, 122, 142. As the cooled air absorbs the heat, it warms up and begins rising. The downward draft of the cooled air shown in the arrows 192A in solid lines and the upward draft of the heated air shown in arrows 194A in broken lines create a generally constant airflow between the servers 112, 122, 142 and the cooling units 190A-190F.

The fans 132A, 132B, 182 pull in air from one direction relative to the fans and push the pulled-in air in another, direction relative to the fans. The direction that air is pushed and pulled is dependent on the angling of the fan blades and direction of rotation of the fan blades. In the implementation illustrated in FIG. 1A, the blades of the fan 182 are oriented in such a way that the cooled air emitted from the cooling units 190A is pulled towards the fan 182, and is pushed towards the first, second, and third racks 110, 120, 140 The blades of the fans 132A, 132B are oriented in such a way that the heated air from the first, second and third racks 110, 120, 140 is pulled into the hot air vents 130, 150 and pushes upward in the hot air vents 130, 150.

In one example, the cooling system further includes one or more wind turbines 200A, 200B, 200C. The wind turbines 200A, 200B are arranged between the first and second hot air vents 130, 150, and the cooling units 190A. 190B in the space 165. The wind turbines 200A, 200B are configured to generate power, for example, electricity, when the blades of the turbines rotate. The wind turbine 200C is arranged downstream of the cooling unit 190A. As the heated air moving from the hot air vents 130, 150 rotate the blades of the wind turbines 200A, 200B, the power produced by the rotation of the turbine blades may be used to run an electrical generator (not shown). Likewise, as the cooled air emitted from the cooling unit 190A moving downward rotate the blades of the wind turbine 200C, the power produced by the rotation of the turbine blades may be used to run an electrical generator (not shown). In some implementations, the wind turbines 200A, 200B, 200C may be small scale or residential wind turbines. The constant airflow of the heated air and the cooled air serves to drive the wind turbines 200A, 200B, 200C, which in turn generate power. Thus, energy from the constant airflow may be captured without incurring any additional energy expenditure.

Figure 2:
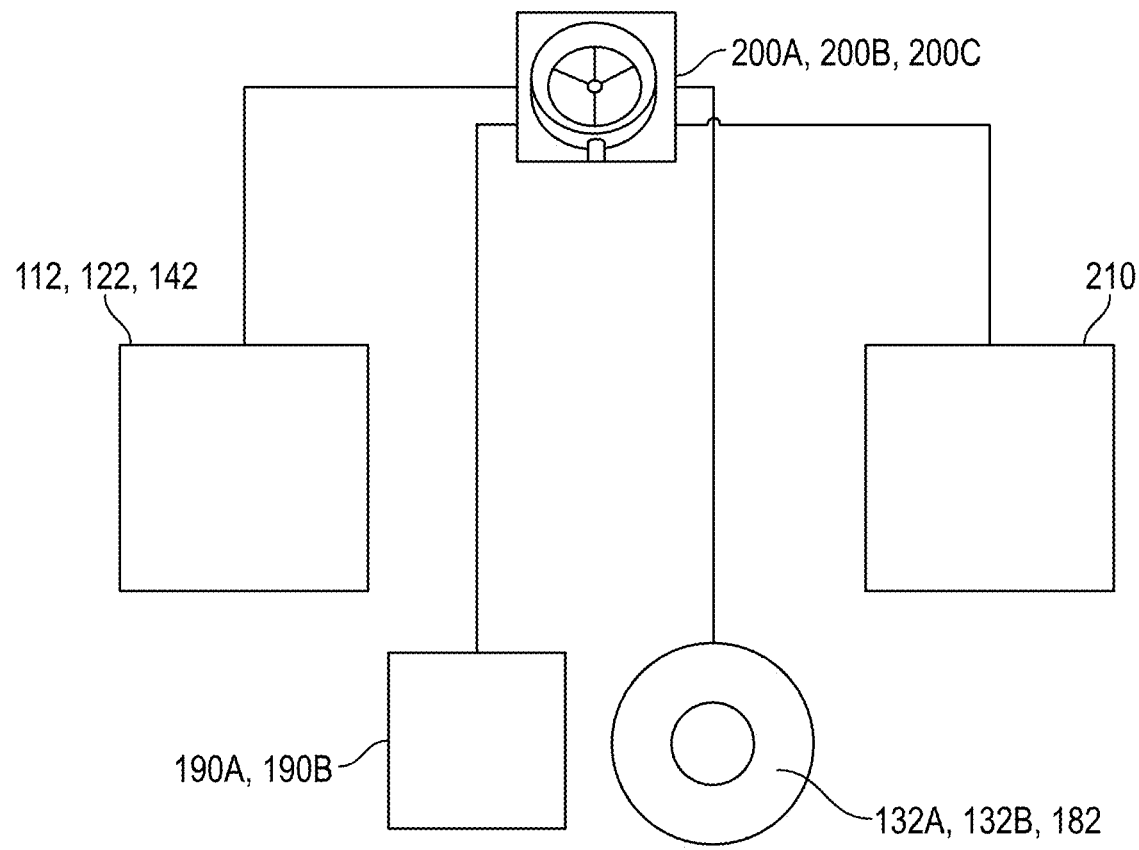
FIG. 2 is a schematic view of an energy supply network associated with a wind turbine according to aspects of the disclosure.

Referring now to FIG. 2, the power, or a portion thereof, generated by the wind turbines 200A, 200B, 200C may be supplied, for example, to one or more of the cooling units 190A-190F thereby reducing the energy consumption of the cooling units 190A-190F. In another example, the power, or a portion thereof, generated by the wind turbine 200A, 200B, 200C may also be supplied to one or more of the servers 112, 122, 142 and/or the fan or blowers 132A, 132B, 182 and/or other consumers in the data centers, thereby reducing the energy consumption of the data center.

Since the power generated by the wind turbines 200A, 200B, 200C is supplied directly to one or more of the cooling units 190A-190F or other components of the data center, which are in the vicinity of the wind turbines 200A, 200B, 200C, de minimus power is wasted in transmission of the generated power. Furthermore, since the generated power may be utilized by the air cooling system, for example, as it is created, there is no need to store the power, thereby avoiding power leakage associated with the storage of power.

However, in some instances, the generated power, or a portion thereof, may be stored in one or more batteries 210, for example, which may serve as a back-up power source in case of loss of power or other emergency situations. By temporarily storing a portion of the power generated by the wind turbines 200A, 200B, 200C, the need for other back-up energy sources may be reduced.

Existing data centers may be retrofitted with one or more small-scale wind turbines 200A, 200B, 200C. For example, the wind turbines 200A, 200B may be arranged between the server racks 110, 120, 140 and the cooling units 190A, 190B. The wind turbines 200A, 200B may recapture the energy from the constant airflow generated by the heated air rising up the hot air vents 130, 150, and cooled air directed down toward the server racks 110, 120, 140 as described above. In addition, or alternatively, the wind turbine 200C may be arranged downstream of one or more of the cooling units 190A-190F to recapture the energy from the cooled air emitted from the one or more of the cooling units 190A-190F.

Figure 3:
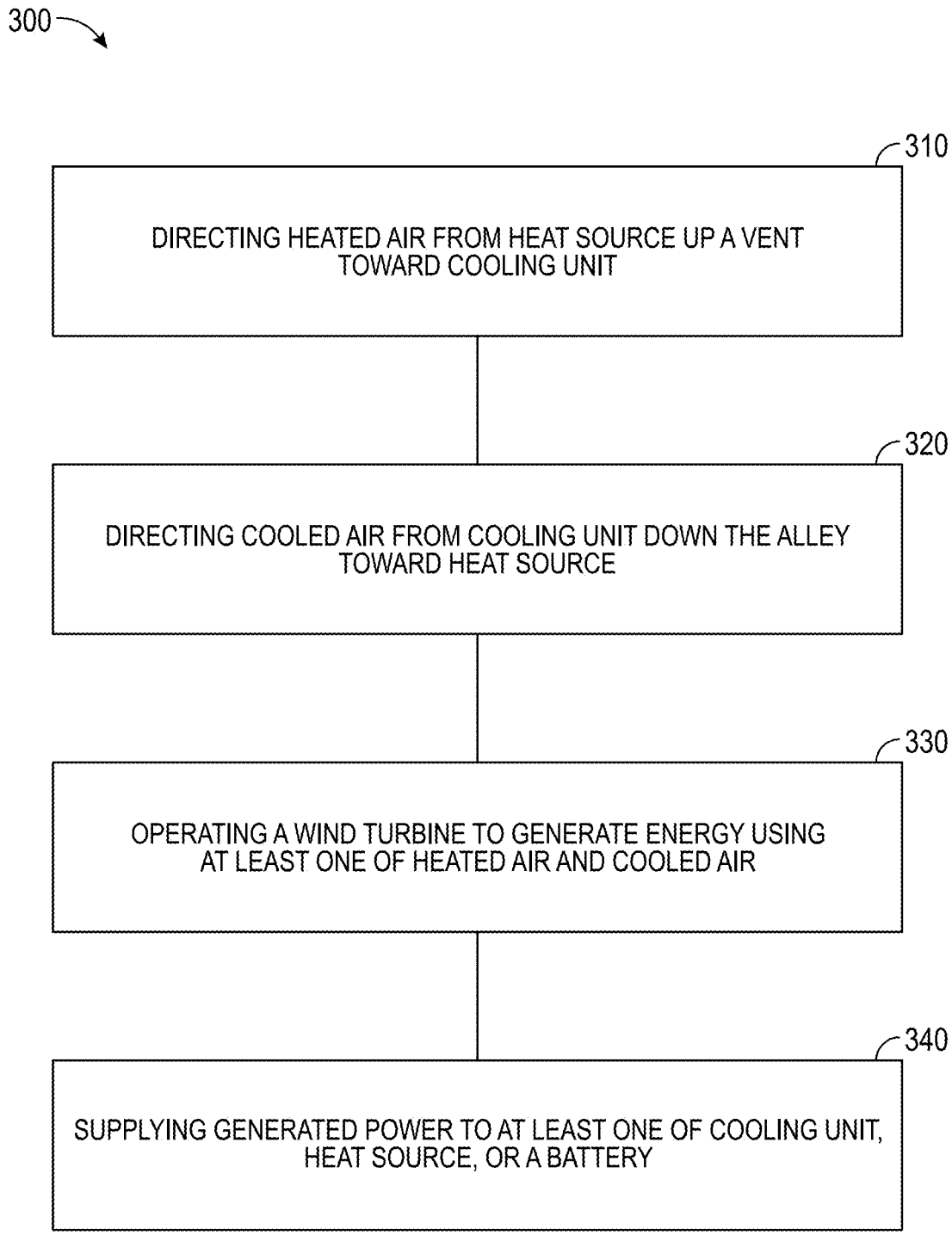
FIG. 3 is a flow chart illustrating a method for recapturing energy according to aspects of the disclosure.

FIG. 3 is a flow-chart of a method 300 for recapturing energy using a cooling system. The method 300 includes directing air heated by a heat source, for example, plurality of servers 112, 122, 142, associated with the hot air vent 130, 150 upward along the hot air vent 130, 150, at 310. Heated air naturally tends to rise upward. In addition, the blower or fans 132A, 132B may be arranged to direct the heated air up along the hot air vents 130, 150, respectively, toward the cooling units 190A-190F. At 320, the method 300 includes directing air cooled by the cooling units 190A-190F down the first and second alleys 180, 225 toward the plurality of servers 112, 122, 142. For example, the internal blowers (not shown) of the cooling units 190A-190F are configured to direct the cooled air emitted from the cooling units 190A-190F down the first and second alleys 180, 225 in a desired direction towards the plurality of servers 112, 122, 142. At 330, the method 300 includes operating the wind turbines 200A, 200B, 200C to generate power using at least one of the heated air rising up the hot air vents 130, 150 and the cooled air emitted from the cooling units 190A-190F. As described above, the heated air directed upward along the hot air vents 130, 150 may rotate the turbine blades of the wind turbines 200A, 200B, 200C, which in turn may drive electrical generators (not shown) to generate power. At 340, the method 300 includes supplying power generated by the wind turbines 200A, 200B, 200C to at least one of the cooling units 190A-190F the heat sources 112, 122, 142, the fans 132A, 132B, 182, or the battery 210.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the examples should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible examples. Further, the same reference numbers in different drawings can identify the same or similar elements.

The invention claimed is:

1. A system comprising:
    a hot air vent extending about a heat source, the hot air vent configured to produce an air flow by directing air heated by the heat source to rise upward along the hot air vent;
    at least one wind turbine arranged at a top of the hot air vent, the at least one wind turbine configured to be operated by the heated air rising upward along the hot air vent;
    a cooling unit mounted to a ceiling above the hot air vent and configured to cool the heated air rising from the hot air vent and to direct the cooled air down an alley about the heat source producing the air circulation in the alley; and
    a space adjacent to the ceiling, the space configured to receive the heated air exiting the at least one wind turbine and to direct the heated air to the cooling unit.

2. The system according to claim 1, wherein one of the at least one wind turbine is arranged between the hot air vent and the cooling unit.

3. The system according to claim 1, wherein the heat source is a server.

4. The system according to claim 1, wherein the at least one wind turbine is a residential wind turbine.

5. The system according to claim 1, wherein the at least one wind turbine is configured to provide power to at least one of the heat source or the cooling unit.

6. The system according to claim 1, further comprising a battery for storing power generated by the at least one wind turbine.

7. A data center comprising:
    a plurality of servers;
    a hot air vent extending about the plurality of servers, the hot air vent configured to direct air heated by the plurality of the servers upward along the hot air vent;
    an alley defined adjacent the plurality of servers,
    a cooling unit arranged above the plurality of servers and mounted to a ceiling of the data center and configured to receive the heated air, to cool the heated air and to direct the cooled air down the alley toward the plurality of servers; and at least one wind turbine arranged between the hot air vent and the cooling unit in a space adjacent to the ceiling or downstream of the cooling unit in the alley, the at least one wind turbine configured to be operated by at least one of the heated air rising from the hot air vent or the cooled air emitted from the cooling unit to generate power.

8. The system according to claim 7, wherein the at least one wind turbine is a residential wind turbine.

9. The system according to claim 7, wherein the at least one wind turbine is configured to provide power to at least one of the cooling unit or at least one of plurality of the servers.

10. The system according to claim 7, further comprising a first blower configured to direct the heated air upward along the hot air vent and/or a second blower configured to direct the cooled air from the cooling unit toward the plurality of servers.

11. The data center according to claim 7, further comprising a battery for storing power generated by the wind turbine.

12. A method for recapturing energy, the method comprising:

directing air heated by a heat source associated with a hot air vent upward along the hot air vent to a space adjacent to a ceiling;

directing the heated air in the space to a cooling unit mounted to the ceiling;

directing air cooled by the cooling unit mounted to the ceiling down an alley adjacent to the heat source toward the heat source underneath the cooling unit; and operating at least one wind turbine arranged between the hot air vent and the cooling unit in the space or downstream the cooling unit in the alley to recapture energy from at least one of the heated air or the cooled air, respectively, the at least one wind turbine operated by at least one of the heated air or the cooled air to generate power.

13. The method according to claim 12, wherein the heat source comprises a server.

14. The method according to claim 12, wherein the at least one wind turbine is a residential wind turbine.

15. The method according to claim 12, further comprising supplying power generated by the at least one wind turbine to the heat source.

16. The method according to claim 12, further comprising supplying power generated by the at least one wind turbine to the cooling unit.

17. The method according to claim 12, further comprising supplying power generated by the at least one wind turbine to a battery.

18. A system comprising:

a cooling unit mounted to a ceiling and configured to direct cooled air toward a heat source along an alley defined adjacent the heat source; and at least one wind turbine arranged downstream of the cooling unit in the alley, the at least one wind turbine configured to be operated by the cooled air emitted from the cooling unit.

* * * * *